(12) United States Patent
Kim et al.

(10) Patent No.: US 7,254,769 B2
(45) Date of Patent: Aug. 7, 2007

(54) ENCODING/DECODING APPARATUS USING LOW DENSITY PARITY CHECK CODE

(75) Inventors: Jung-Im Kim, Daejeon (KR); Young-Jo Ko, Daejeon (KR)

(73) Assignee: Electronics and Telecommunications Research Insitute (KR)

( * ) Notice: Subject to any disclaimer, the term of this patent is extended or adjusted under 35 U.S.C. 154(b) by 462 days.

(21) Appl. No.: 10/693,545

(22) Filed: Oct. 23, 2003

(65) Prior Publication Data

US 2004/0123229 A1 Jun. 24, 2004

(30) Foreign Application Priority Data

Dec. 24, 2002 (KR) .................. 10-2002-0083722
Apr. 30, 2003 (KR) .................. 10-2003-0027430

(51) Int. Cl.
 *H03M 13/00* (2006.01)
(52) U.S. Cl. ...................... 714/774; 714/757
(58) Field of Classification Search ............ 714/774, 714/800

See application file for complete search history.

(56) References Cited

U.S. PATENT DOCUMENTS 6,028,933 A * 2/2000 Heer et al. ............ 713/169
6,029,264 A * 2/2000 Kobayashi et al. ......... 714/755
6,686,853 B2 * 2/2004 Shen et al. .................. 341/50
7,000,174 B2 * 2/2006 Mantha et al. ............. 714/790

FOREIGN PATENT DOCUMENTS

WO    WO 01/37433 A1    5/2001

OTHER PUBLICATIONS

IEEE Transactions on Information Theory, vol. 47, No. 2, Feb. 2001, pp. 619-637.

* cited by examiner

*Primary Examiner*—Guy J. Lamarre
(74) *Attorney, Agent, or Firm*—Blakely Sokoloff Taylor & Zafman

(57) ABSTRACT

Disclosed is an encoding/decoding apparatus of a HARQ system using LDPC codes. A first LDPC code encoding apparatus encodes input information data and transmits the encoded data to the decoding apparatus. An interleaver interleaves the input information data. A second LDPC code encoder in parallel with the first LDPC code encoder performs LDPC code encoding on an output of the interleaver so as to transmit it to the decoding apparatus. The first LDPC code encoder transmits an output signal to the decoding apparatus at odd numbered retransmissions in response to a retransmission request from the decoding apparatus, and the second LDPC code encoder transmits an output signal to the decoding apparatus at even numbered retransmissions in response to the retransmission request from the decoding apparatus.

20 Claims, 6 Drawing Sheets

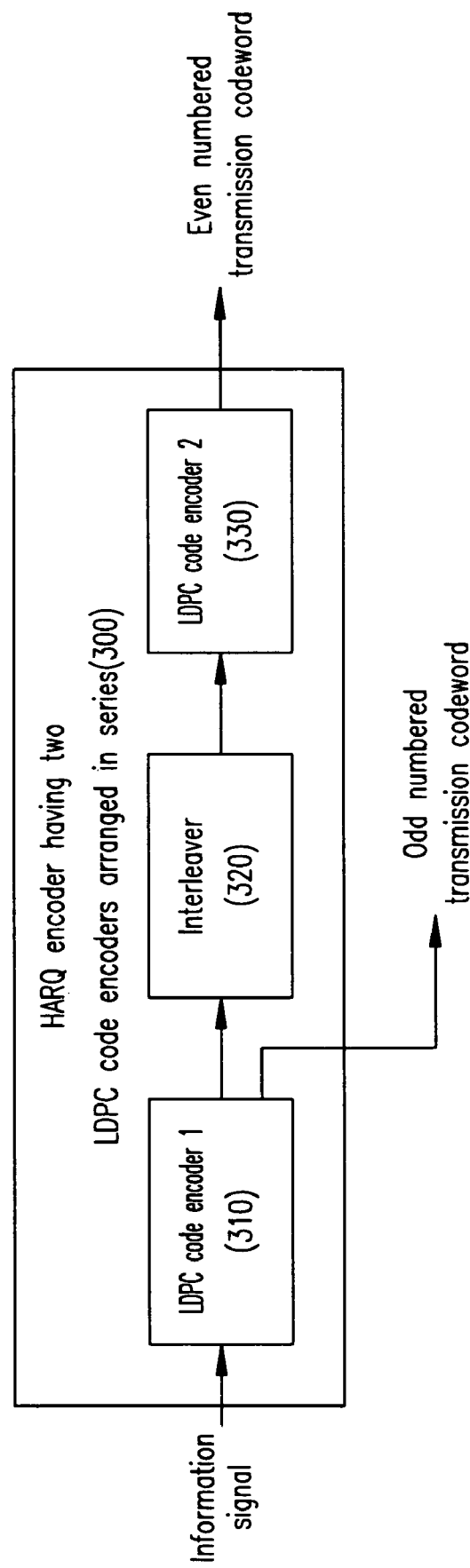

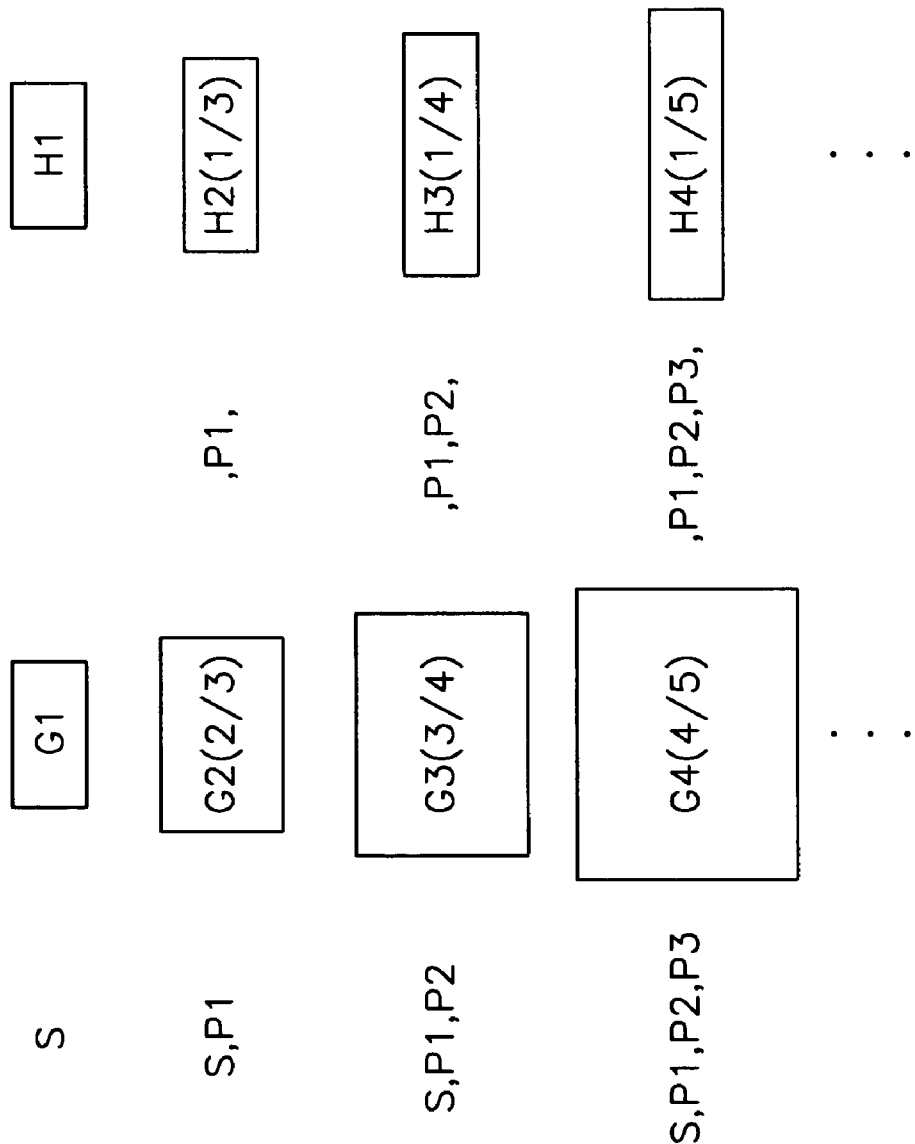

ENCODING/DECODING APPARATUS USING LOW DENSITY PARITY CHECK CODE

CROSS REFERENCE TO RELATED APPLICATION

This application is based on Korea Patent Applications No. 2002-83722 filed on Dec. 24, 2002 and No. 2003-27430 filed on Apr. 30, 2003 in the Korean Intellectual Property Office, the content of which is incorporated herein by reference.

BACKGROUND OF THE INVENTION (a) Field of the Invention

The present invention relates to a Hybrid Automatic Repeat Request (HARQ) system, and in particular, to an encoding/decoding apparatus of the HARQ system for enhancing error correction performance and packet data transmission efficiency by utilizing Low Density Parity Check (LDPC) codes and by interleaving packets for retransmission.

(b) Description of the Related Art

In communication systems, two basic strategies for dealing with errors have been developed. One is to include only enough redundancy to allow a receiver to deduce that an error has occurred, but not which error, and have it request a retransmission to the sender (Automatic Repeat Request: ARQ). The other way is to include enough redundant information along with each data block sent to enable the receiver to deduce what the transmitted character must have been (Forward Error Correction: FEC). The former uses error-detecting codes, and the latter uses error-correcting codes.

Transmission systems, particularly mobile communication systems, have recently begun to use a combination of ARQ protocols and FEC for high speed data transmission, which is called Hybrid ARQ (HARQ). HARQ compensates for drawbacks of ARQ, i.e., a decrease of throughput due to a large number of retransmissions for low signal-to-noise ratio (SNR), by combining with FEC. In HARQ, turbo codes are used for FEC, and Chase combining and Incremental Redundancy are used for ARQ.

In Evolution Data Only (EV-DO) and High Speed Downlink Packet Access (HSDPA) systems, information is transmitted in packet units encoded by a turbo encoder, and the packet is decoded at the receiver by a turbo decoder using the same encoding/decoding scheme. When the turbo decoder fails to decode the packet, the receiver reports the decoding failure to the transmitter so as to retransmit the packet.

At the receiver, whether or not the packet is successfully decoded is determined by a CRC check on the output of the decoder. When the packet passes the CRC check, the receiver transmits an acknowledgement (ACK) to the transmitter. Otherwise, the receiver transmits a negative acknowledgement (NACK) to the transmitter. The transmitter transmits the next data packet when receiving the ACK. On the other hand, if receiving a NACK, the transmitter retransmits the packet up to a predetermined number of times.

In Chase combining, the transmitter uses the same data packet at both initial transmission and retransmission, and then the receiver combines the initially transmitted packet with the retransmitted packet and performs a decoding operation on the combined packet. The transmitter transmits the next packet when receiving an ACK, and retransmits the previously transmitted packet up to a predetermined number of times when receiving a NACK.

Typically, the transmitter adds redundancy bits to the data to be transmitted so as to allow the decoder to perform correction. In the Incremental Redundancy scheme, the transmitter increments redundancy bits when the packet is retransmitted, i.e., increases a coding rate of retransmission from that of an initial transmission, resulting in enhancement of decoding efficiency at the receiver. Accordingly, the receiver performs the decoding operation using the initially transmitted packet and the retransmitted packet. Chase combining can obtain a diversity gain without an increase of system complexity since the same packet is retransmitted. On the other hand, the Incremental Redundancy increases the system complexity at both the encoder and decoder since the coding rate varies whenever the retransmission is performed again. However, the Incremental Redundancy relatively improves the decoding probability of the transmitted data using the different coding rates. Accordingly, the Incremental Redundancy scheme has been known to show high performance since it provides both diversity gain and coding gain. That is, Incremental Redundancy is superior to Chase combining in view of system performance, while Chase combining is superior to Incremental Redundancy in view of low system complexity.

Two outstanding error correction coding schemes are Block codes and Trellis codes. One Example of Block codes is LDPC codes, and an example of Trellis codes is a convolutional turbo code.

In the case of block codes, the characteristics of the encoder and decoder are determined by a Generating matrix (G) and a Parity Check matrix (H). Basically, the LDPC code is encoded by one encoder and then repeatedly decoded by one decoder so as to show a high performance identical with the turbo code. At that time, the decoder performs decoding by calculating a probability satisfying the relationship (H·C=0) of the parity check bit matrix (H) and a received codeword (C).

In the case of a Trellis code, the encoder encodes a Trellis code using a generator polynomial, and the decoder performs decoding by calculating all of the probabilities of the Trellis codes.

As described above, even though LDPC coding allows the decoder to calculate the relationships (H C=0) of the parity check matrix (H) and the received codeword (C) in parallel, Trellis coding does not support the parallel calculation of the probabilities which increases calculation time.

The turbo code is generated with two convolutional component encoders separated by one interleaver, and is then decoded by two decoders recursively so as to guarantee performance. That is, it is not expected to obtain good performance of the turbo code with only one encoder and one decoder.

FIG. 1 is a conceptual view illustrating a Hybrid Automatic Repeat Request (HARQ) scheme adopted to EV-DO and HSDPA systems.

In FIG. 1, the turbo code encoder consists of first and second convolutional encoders, an interleaver, and a puncturer. The turbo code encoder is a HARQ encoder (The construction of the turbo code encoder is identical when the retransmission function is disabled).

A conventional HARQ technique will be described hereinafter when Chase combining is performed in a ⅓ code rate.

Firstly, the transmitter sends data X, Y1, and Z2, and the receiver performs decoding and CRC. As a result of the CRC, the receiver stores the data and requests retransmission of the data when the decoding has failed such that the transmitter retransmits the X, Y1, and Z2.

When the receiver fails to decode the data again and the current number of retransmission times does not exceed the predetermined number of retransmission times, the receiver requests retransmission again. This process continues until the number of retransmission times reaches the predetermined number of retransmission times.

On the other hand, when the data X, Y1, and Z2 are transmitted in the Incremental Redundancy scheme and the receiver fails to decode the data, the receiver stores the decoding result and requests retransmission of the data. Upon reception of the retransmission request, the transmitter transmits the data X', Y2, and Z1 and the receiver performs decoding using the currently received data and the previously stored data. When the receiver fails to decode the data again and the current number of retransmission times does not exceed the predetermined number of retransmission times, the receiver requests retransmission again. The transmitter sends the data X, Y1, and Z2 during the odd numbered retransmissions and the data X', Y2, Z1 during the even numbered retransmissions. This process continues until the number of retransmissions reaches the predetermined number.

The error correction scheme using the turbo codes as described above has drawbacks of an error floor effect in which the system performance is not improved even when increasing signal power at the operation point, and it requires much decoding time due to the sequential decoding operation in units of symbols.

SUMMARY OF THE INVENTION

It is an advantage of the present invention to provide an encoding/decoding apparatus of a hybrid automatic repeat request system (HARQ) using LDPC codes, which allows the decoder to process parallel calculations.

The encoding/decoding apparatus according to the preferred embodiment of the present is characterized in that the HARQ encoder uses LDPC code encoders, i.e. two LDPC code encoders and one interleaver, unlike the conventional HARQ encoder which uses a turbo encoder.

The HARQ system using LDPC codes can be implemented with a Chase combining or an Incremental Redundancy scheme. In the Incremental Redundancy scheme the generating matrix G and parity check matrix H can be constituted as shown in FIG. 4. Here, G1 and H1 are of an initial transmission, G2 and H2 are of a second transmission, and G3 and H3 are of a third transmission. The size of the matrix increases as the number of retransmission times increases such that the Incremental Redundancy scheme increases the system complexity.

The Incremental Redundancy scheme increases system complexity in enhancement of the system performance since it does not show a performance improvement even when the code rate decreases from ½, in comparison with the turbo codes. Accordingly, in a system requiring appropriate complexity, the Chase combining scheme is preferable to the Incremental Redundancy scheme.

The present invention proposes a modified Chase combining scheme that is superior to the conventional Chase combining scheme in view of performance.

In the typical Chase combining scheme, one encoder and one decoder are used such that the transmitter performs encoding with one encoder and retransmits an identical packet, and the receiver performs decoding on the result obtained by multiplying a signal-to-noise ratio of the previously decoded result and the currently receive codeword as a weight, with the codeword.

In the present invention, the two LDPC code decoders communicate much information so as to improve the decoding accuracy relative to using only one LDPC code decoder.

In one aspect of the present invention, the encoding apparatus of a HARQ system using LDPC codes comprises a first LDPC code encoder that performs LDPC code encoding on the input information data and transmits the encoded data to the decoding apparatus; an interleaver that performs interleaving on the input information data; and a second LDPC code encoder that is arranged in parallel with the first LDPC code encoder and performs LDPC code encoding on the output of the interleaver, wherein the first LDPC code encoder transmits an output signal to the decoding apparatus at an odd numbered retransmission in response to a retransmission request from the decoding apparatus, and the second LDPC code encoder transmits an output signal to the decoding apparatus at an even numbered retransmission in response to the retransmission request from the decoding apparatus.

The encoding apparatus further includes an encoding controller that controls the first LDPC code encoder for odd numbered retransmissions and controls the second LDPC code encoder for even numbered retransmissions, when receiving a retransmission request from the decoding apparatus.

The first LDPC code encoder and the second LDPC code encoder have the same generating matrix and parity check matrix.

The first and second LDPC code encoders perform retransmission according to a Chase combining scheme in response to the retransmission request from the decoding apparatus.

A decoding apparatus of the HARQ system using the LDPC codes according to the present invention comprises a first LDPC code decoder and a second LDPC code decoder that perform LDPC code decoding on the codeword transmitted from the encoding apparatus; an interleaver that performs interleaving on an output of the first LDPC code decoder and outputs the interleaved data to the second LDPC code decoder; and a deinterleaver that performs deinterleaving on an output of the second LDPC code decoder and outputs the deinterleaved data to the first LDPC code decoder, wherein the first LDPC code decoder performs decoding on the codeword newly received from the encoding apparatus and an odd numbered retransmitted codeword from the encoding apparatus due to a transmission error, the second LDPC code decoder performs decoding on an even numbered retransmitted codeword from the encoding apparatus due to the transmission error, the codeword newly transmitted from the encoding apparatus is processed and then finally outputted from the first LDPC code decoder, and the codeword retransmitted from the encoding apparatus is processed and then finally outputted from the interleaver.

The decoding apparatus further includes a CRC check unit that performs CRC checking on the outputs of the first and the second LDPC code decoders; and a decoding controller that determines whether or not the decoding is successful according to a result of the CRC checking, feeds back a checking result to the encoding apparatus, and controls the first and second LDPC code decoders to perform decoding of the newly transmitted codeword and retransmitted codeword.

The first LDPC code decoder performs decoding on the odd numbered retransmitted codeword with the output of the deinterleaver.

The second LDPC code decoder performs decoding on the even numbered retransmitted codeword with the output of the interleaver.

When the retransmission is requested due to a decoding failure on the output of the first LDPC code decoder, the second LDPC code decoder receives an even numbered retransmitted codeword from the encoding apparatus.

When the retransmission is requested due to a decoding failure on the output of the second LDPC code decoder, the first LDPC code decoder receives an odd numbered retransmitted codeword from the encoding apparatus.

In another aspect of the present invention, the encoding apparatus of a HARQ system using LDPC codes comprises a first LDPC code encoder that performs LDPC code encoding on input information data and transmits the encoded data to the decoding apparatus; an interleaver that performs interleaving on an output of the first LDPC code encoder; and a second LDPC code encoder that is arranged in series with the first LDPC code encoder, which performs encoding on an output of the interleaver, and transmits the encoded data to the decoding apparatus, wherein the first LDPC code encoder performs odd numbered retransmissions according to a retransmission request from the decoding apparatus; the second LDPC code encoder performs even numbered retransmissions according to the retransmission request from the decoding apparatus; and the codeword transmitted by the encoding apparatus is finally decoded by the first LDPC code decoder so as to be outputted.

The first and second LDPC code encoders perform retransmission according to a Chase combining scheme in response to the retransmission request from the decoding apparatus.

In another aspect of the present invention, the decoding apparatus of a HARQ system using LDPC codes comprises a first LDPC code decoder and a second LDPC code decoder that perform LDPC code decoding on a codeword transmitted from an encoding apparatus; an interleaver that performs interleaving on an output of the first LDPC code decoder and outputs it to the second LDPC code decoder; and a deinterleaver that performs deinterleaving on an output of the second LDPC code decoder and outputs it to the first LDPC code decoder, wherein the first LDPC code decoder performs decoding on a codeword newly received from the encoding apparatus and an odd numbered retransmitted codeword from the encoding apparatus, due to a transmission error, and the second LDPC code decoder performs decoding on an even numbered retransmitted codeword from the encoding apparatus, due to the transmission error.

The decoding apparatus further includes a CRC check unit that performs CRC checking on the output of the first LDPC code decoder; and a decoding controller that determines whether or not the decoding is successful according to a result of the CRC checking, feeds back a checking result to the encoding apparatus, and controls the first and second LDPC code decoders to perform decoding of the newly transmitted codeword and retransmitted codeword.

The first LDPC code decoder performs decoding on the odd numbered retransmitted codeword with the output of the deinterleaver, and the second LDPC code decoder performs decoding on the even numbered retransmitted codeword with the output of the interleaver. The retransmission request is sent to the encoding apparatus when the output of the first LDPC code decoder fails to pass the CRC checking. When the output of the first LDPC code decoder corresponding to the odd numbered retransmitted codeword fails to pass the CRC checking, the output of the first LDPC code decoder is recursively decoded through the interleaver, the second LDPC code decoder, the deinterleaver, and the first LDPC code decoder.

When the output of the first LDPC code decoder corresponding to an even numbered retransmitted codeword, which is processed by the second LDPC code decoder and deinterleaver, fails to pass the CRC checking, the output of the first LDPC code decoder is recursively processed by the interleaver, the second LDPC code decoder, the deinterleaver, and the first LDPC code decoder.

BRIEF DESCRIPTION OF THE DRAWINGS

The accompanying drawings, which are incorporated in and constitute a part of the specification, illustrate an embodiment of the invention, and, together with the description, serve to explain the principles of the invention:

FIG. 3a is a block diagram illustrating an LDPC code encoding apparatus for a HARQ system according to a second embodiment of the present invention;

FIG. 4 is a drawing for illustrating a generating matrix and parity check matrix in an Incremental Redundancy scheme adopted for a HARQ system.

DETAILED DESCRIPTION OF THE PREFERRED EMBODIMENTS

Figure 1:
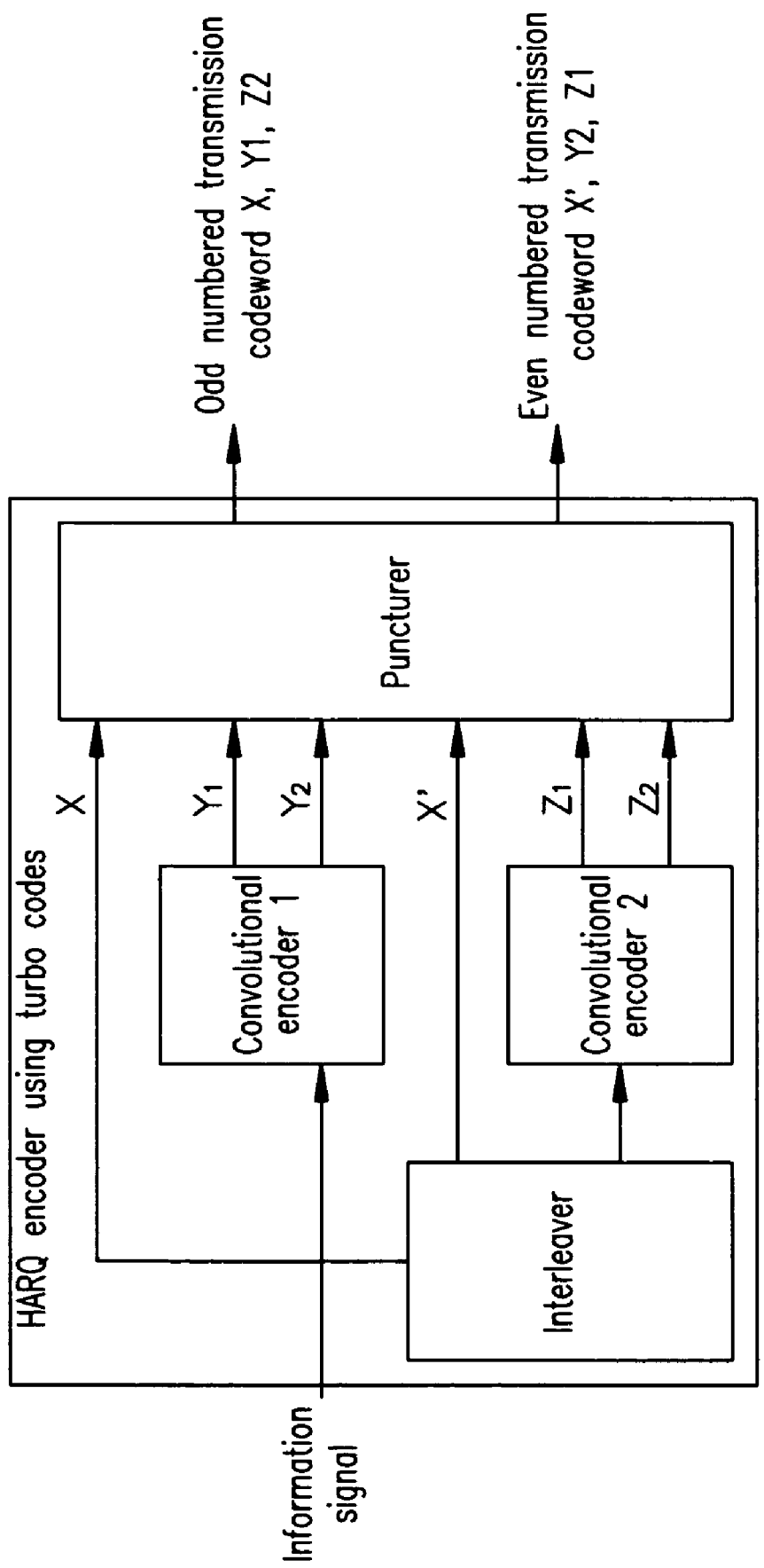
FIG. 1 is a conceptual view for illustrating a HARQ scheme adopted to EV-DO and HSDPA systems.

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. Parts and functions which are not directly related to the present invention will be omitted, and similar parts are designated by identical reference numerals in the drawings.

The encoding/decoding apparatus using the LDPC codes in the HARQ system according to the preferred embodiment of the present invention will be described with reference to the accompanying drawings.

Figure 2A:
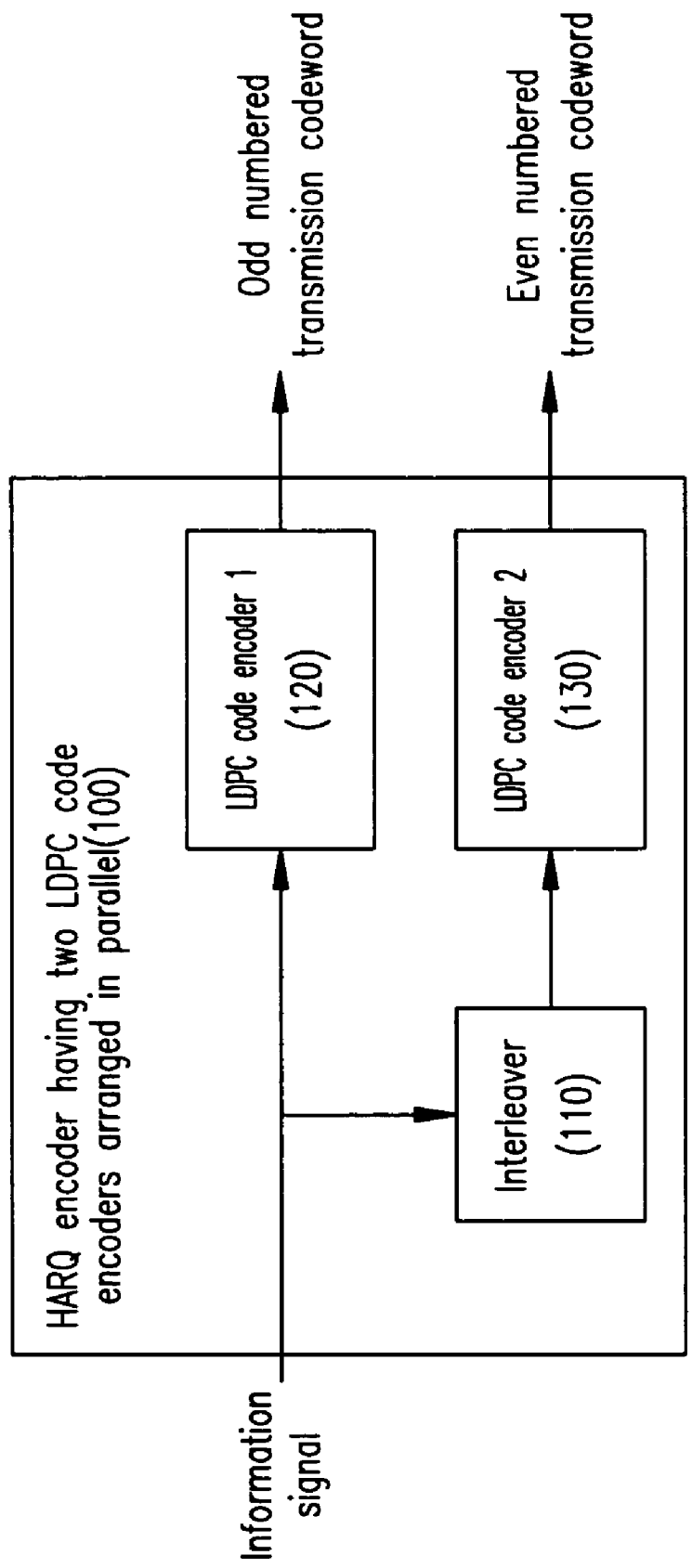
FIG. 2a is a block diagram illustrating an LDPC code encoding apparatus for a HARQ system according to a first embodiment of the present invention.
Figure 2B:
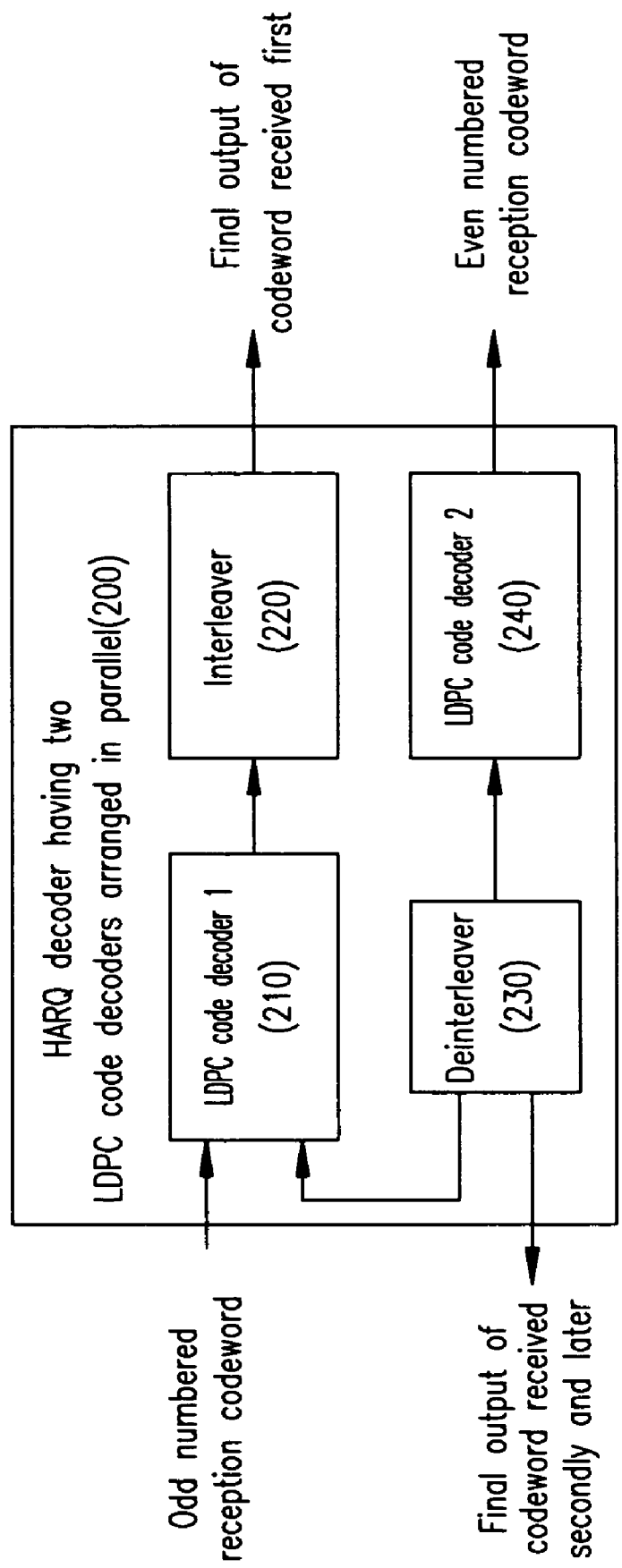
FIG. 2b is a block diagram illustrating an LDPC code decoding apparatus for a HARQ system according to the first embodiment of the present invention.

FIG. 2a and FIG. 2b respectively show an LDPC code encoding apparatus 100 and an LDPC code decoding apparatus 200 for a HARQ system according to a preferred embodiment of the present invention.

The LDPC code encoding apparatus 100 includes an interleaver 110, and a pair of first and second LDPC code encoders 120 and 130.

The first LDPC code encoder 120 performs LDPC code encoding on the input information bits so as to output an LDPC code.

The first LDPC code encoder 120 can be a conventional one such as an LDPC code encoder as disclosed in "Design of Capacity-Approaching Irregular Low-Density Parity-Check Codes" (IEEE TRANSACTIONS ON INFORMA- TION THEORY, VOL. 47, NO.2, FEBRUARY 2001) by Thomas J. Richardson and M. Amin Shokrollahi et al.

The interleaver 110 performs interleaving on the input signal and outputs it to the second LDPC code encoder 130. The interleaver 110 can be one of a well known random interleaver, a turbo code internal interleaver specified in the 3GPP TS 25.212 for a WCDMA physical layer, a block interleaver, etc.

The second LDPC code encoder 130 performs LDPC code encoding to the output signal of the interleaver 110 and outputs an LDPC code. The second encoder is the same as the first encoder 120.

The first and second LDPC code encoders 120 and 130 are arranged in parallel to the information signal.

If the first and second LDPC code encoders 120 and 130 are arranged in parallel and are identical with each other, that is, the two encoders perform encoding on the same information signal inputs, a decoding apparatus 200 should be implemented with the LDPC code decoders operating with the same encoding/decoding scheme such that the system can be implemented without large system complexity and can improve signal decoding performance.

The first LDPC code encoder 120 can be expressed with the generating matrix G ($G=G_{i,j}=1/0$) or a check matrix, and it outputs I·G=C (C is a codeword) using the input information signal I($I=I_0, I_1, I_2, \ldots, I_k$) or outputs C by setting I and H to satisfy a condition of C·H=0 when the parity check matrix H($H=H_{i,j}=1/0$) is a lower triangular type matrix or its equivalent.

The parity check matrix can be represented as in the following equation 1, which has "1"s in a regular row and column pattern or equation 2 which has an irregular pattern of "1"s in rows and columns. The former is called a regular LDPC code and the latter is called an irregular LDPC code. In the present invention, both the regular LDPC codes and irregular LDPC codes can be used.

$$H = \begin{bmatrix} 1 & 0 & 0 \\ 0 & 1 & 0 \\ 0 & 0 & 1 \end{bmatrix} \quad \text{[equation 1]}$$

$$H = \begin{bmatrix} 1 & 1 & 0 \\ 0 & 1 & 0 \\ 0 & 1 & 1 \end{bmatrix} \quad \text{[equation 2]}$$

The error correction performance of the LDPC codes is determined by the parity check matrix (H), which consists of mostly "0"s (Low Density) and sparse "1"s. The number of "1"s per row or column is called a degree distribution. Since the error correction performance depends on the degree distribution, an optimization process is required. The LDPC code encoder can improve the performance by performing encoding based on the information of the parity check matrix H optimized according to the code rate and the length of the codeword.

The second LDPC code encoder 130 operates in the same manner as the first LDPC code encoder 120, except that the input signals are interleaved by the interleaver 110. Accordingly, a detailed description thereof will be omitted.

The first LDPC code encoder 120 encodes and transmits a newly inputted signal or the stored information signal for retransmission upon reception of an odd numbered retransmission request from the decoding apparatus 200.

On the other hand, the second LDPC code encoder 130 performs encoding on the output signal of the interleaver 110 and transmits the encoded signal to the decoding apparatus 200 upon reception of an even numbered retransmission request.

The decoding apparatus 200 includes a first LDPC code decoder 210, an interleaver 220, a deinterleaver 230, and a second LDPC code decoder 240.

The first LDPC code decoder 210 performs decoding on the codeword received from the encoding apparatus 100. When the codeword is received in response to the odd numbered retransmission request, the encoder performs decoding on the codeword with the data outputted from the deinterleaver 230. The first LDPC code decoder 210 performs decoding using the same encoding/decoding scheme used in the first LDPC code encoder 120, and it can be the LDPC code decoder disclosed in "Design of Capacity-Approaching Irregular Low-Density Parity-Check Codes" (IEEE TRANSACTIONS ON INFORMATION THEORY, VOL. 47, NO.2, FEBRUARY 2001) by Thomas J. Richardson and M. Amin Shokrollahi et al.

The interleaver 220 performs interleaving on the data decoded by the first LDPC code decoder 210 and outputs the interleaved data, and it can be a random interleaver, a turbo code internal interleaver specified in the 3GPP TS 25.212 for a WCDMA physical layer, a block interleaver, etc., identical with the interleaver 110 of the encoding apparatus 100.

The second LDPC code decoder 240 performs decoding on the output signal of the interleaver 220 corresponding to the codeword retransmitted at an even numbered retransmission request. The second LDPC code decoder can be the same as the first LDPC code decoder 210.

The deinterleaver 230 performs deinterleaving on the data outputted from the second LDPC code decoder 240, and outputs the deinterleaved data to the first LDPC code decoder 210.

The deinterleaver 230 is determined according to the interleavers 110 and 220, and it can be one corresponding to the random interleaver, the turbo code internal interleaver specified in the 3GPP TS 25.212 for a WCDMA physical layer, the block interleaver, etc., as described above.

The decoding apparatus 200 can further include a CRC check means for performing CRC checking on the data decoded by the first LDPC code decoder 210 and the second LDPC code decoder 240, and for determining whether the data passes or fails the CRC checking. The description of the CRC check means will be omitted since it is well known to those of ordinary skill in the art. The CRC check means determines whether or not the decoding is successful and transmits the CRC check result to the encoding apparatus 100 using an ACK(CRC pass)/NACK(CRC failure) signal.

The encoding apparatus 100 can further include an encoding control means which, upon reception of the ACK/NACK from the decoding apparatus determines whether or not to perform retransmission, and controls the first LDPC code encoder 120 and the second LDPC code encoder 130 so as to perform retransmission according to whether it is an odd or even numbered retransmission.

Also, the decoding apparatus 200 can further include a decoding control means that controls the decoding of the output signals of the first LDPC code decoder 210 and the second LDPC code decoder 240 corresponding to the codeword newly transmitted or retransmitted from the encoding apparatus 100.

The operation of the encoding and decoding apparatuses using LDPC codes in the HARQ system according to the preferred embodiment of the present invention will be described hereinafter.

Firstly, the transmit side encoding apparatus 100 encodes the information signal to be transmitted with the first LDPC code encoder 120, and then transmits the encoded information signal to the receive side decoding apparatus 200.

If receiving an ACK from the decoding apparatus 200, which indicates that the transmitted signal is successfully decoded, the encoding apparatus 100 inputs a new information signal to the first LDPC code encoder 120 so as to transmit in the above-explained manner.

On the other hand, if receiving a NACK from the decoding apparatus 200, which requests retransmission of the previously transmitted signal, the encoding apparatus 100 determines whether the retransmission request is odd numbered or even numbered. If the retransmission request is a second or later, even numbered request, the encoding apparatus controls in order for the interleaver 110 to interleave the initial information signal and for the second LDPC code encoder 130 to encode the output signal of the interleaver 110 such that the codeword generated by the second LDPC code encoder is transmitted to the decoding apparatus 200. On the other hand, if the retransmission request is an odd numbered request, the encoding apparatus 100 controls such that the first LDPC code encoder 120 generates a codeword identical with the initially transmitted one and transmits the generated codeword to the decoding apparatus 200.

If receiving an initial transmission from the encoding apparatus 100, the decoding apparatus 200 performs decoding and CRC checking on the signal with the first LDPC code decoder, determines whether or not the signal is successfully decoded, and then transmits ACK (successful decoding) or NACK (decoding failure) according to the determination result. If the decoding fails, the decoding result is stored in a storage means.

If receiving a secondly retransmitted codeword from the encoding apparatus 100 due to the decoding failure and the retransmitted codeword is successfully decoded, the second LDPC code decoder 240 performs combining of the codeword with the data obtained through interleaving the initially transmitted codeword by the interleaver 220. Also, the CRC check means performs CRC checking of the output data of the second LDPC code decoder 240 and determines whether or not the output data passed the CRC checking. If the data fails to pass the CRC checking, the decoding apparatus 200 requests retransmission to the encoding apparatus 100.

If receiving a third or later, odd numbered retransmission, the first LDPC code decoder performs decoding on the codeword with the data obtained from the previous even numbered retransmissions by decoding with the second LDPC code decoder 240 and then deinterleaving with the deinterleaver 230. The decoding apparatus 200 performs CRC checking on the codeword decoded in this manner and then transmits the retransmission request to the encoding apparatus 100 if it is required based on whether or not the codeword is successfully decoded.

If receiving a fourth or later, even numbered retransmission, the second LDPC code decoder 240 performs decoding on the codeword with the data obtained from the previous odd numbered retransmissions by decoding with the first LDPC code decoder 210 and then interleaving with the interleaver 220. The decoding apparatus 200 performs CRC checking on the codeword decoded in this manner and then transmits the retransmission request to the encoding apparatus 100 if it is required based on whether or not the codeword is successfully decoded.

Here, the firstly received codeword is finally outputted from the first LDPC code decoder 210, and the secondly received and later codewords are finally outputted from the deinterleaver 230.

As described above, in the preferred embodiment of the present invention, two LDPC code encoders 120 and 130 are used such that the encoding result of the first LDPC code encoder 120 is transmitted at the odd numbered requests and the encoding result of the second LDPC code encoder 130 is transmitted at the even numbered requests, when the retransmission is required.

Even though the turbo code encoder explained with reference to FIG. 1 also uses two encoders, it differs from the encoding apparatus according to the preferred embodiment of the present invention in that the turbo code encoder simultaneously transmits the encoding results of the two encoders to the decoding apparatus.

Figure 3B:
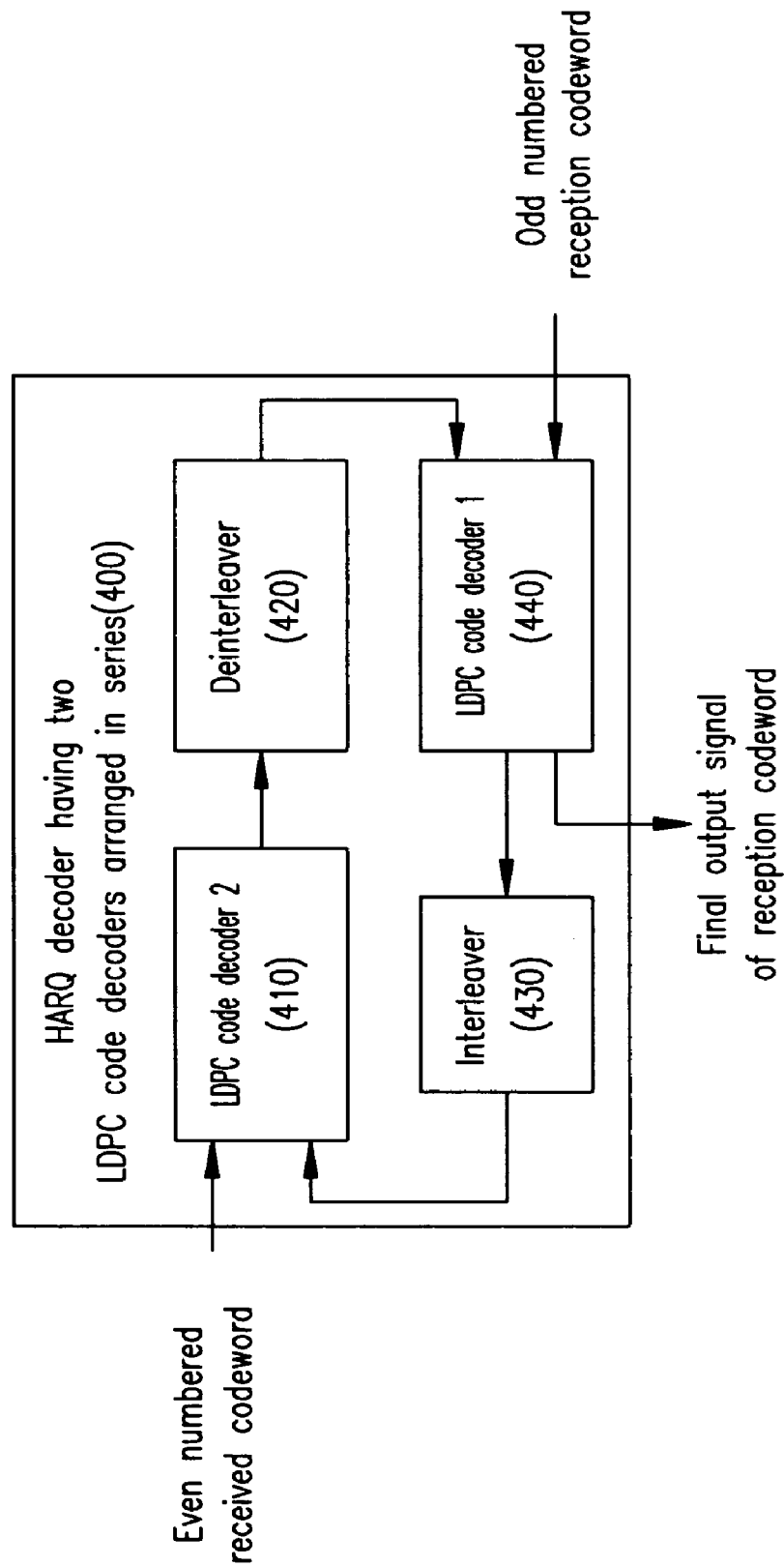
FIG. 3b is a block diagram illustrating an LDPC code decoding apparatus for a HARQ system according to the second embodiment of the present invention.

FIG. 3a and FIG. 3b respectively show an LDPC code encoding apparatus 300 and an LDPC code decoding apparatus 400 for a HARQ system according to a second preferred embodiment of the present invention.

The encoding apparatus 300 includes a first LDPC code encoder 310, an interleaver 320, and a second LDPC code encoder 330.

The first LDPC code encoder 310 performs LDPC code encoding on the information signal so as to output an LDPC code encoded signal.

The first LDPC code encoder 310, as mentioned above, can be the LDPC code decoder disclosed in "Design of Capacity-Approaching Irregular Low-Density Parity-Check Codes" (IEEE TRANSACTIONS ON INFORMATION THEORY, VOL. 47, NO.2, FEBRUARY 2001) by Thomas J. Richardson and M. Amin Shokrollahi et al.

The interleaver 320 performs interleaving on the codeword encoded by the first LDPC code encoder 310 and then outputs the LDPC code to the second LDPC code encoder 330. The interleaver 320, as in the above, can be one of a well known random interleaver, a turbo code internal interleaver specified in the 3GPP TS 25.212 for a WCDMA physical layer, a block interleaver, etc.

The second LDPC code encoder 330 performs encoding on the output signal of the interleaver 320 and then outputs an LDPC code encoded signal. The second LDPC code encoder 330 can be the same as the first LDPC code encoder.

The first and second LDPC code encoders 310 and 330 are connected in series in view of the information signal flow.

The first LDPC code encoder 310 performs encoding on a new information signal or the same information signal as in the initial transmission when an odd numbered retransmission is requested by the decoding apparatus 400.

On the other hand, the second LDPC code encoder 330 performs encoding on the output signal of the interleaver 320 and transmits the encoded signal to the decoding apparatus 400 when an even numbered retransmission is requested from the decoding apparatus 400. At this time, the output of the interleaver 320 results by interleaving a codeword encoded by the first LDPC code encoder 310, unlike in the first embodiment of the present invention, and this difference is also adopted to the decoding apparatus 400.

The decoding apparatus 400 includes a first LDPC code decoder 440, an interleaver 430, a deinterleaver 420, and a second LDPC code decoder 410.

The first LDPC code decoder 440 performs LDPC code decoding on the codeword that is LDPC code-encoded and transmitted from the encoding apparatus 300. At this time, the codeword retransmitted in response to the odd numbered retransmission request is encoded with the data outputted from the deinterleaver 420. The first LDPC code decoder 440 performs decoding corresponding to the encoding performed by the first LDPC code encoder 310 and can be the LDPC code encoder disclosed in "Design of Capacity-Approaching Irregular Low-Density Parity-Check Codes" (IEEE TRANSACTIONS ON INFORMATION THEORY, VOL. 47, NO.2, FEBRUARY 2001), Thomas J. Richardson and M. Amin Shokrollahi et al.

The interleaver 430 performs interleaving on the data decoded by the first LDPC code decoder 440, and it can be one of a well known random interleaver, a turbo code internal interleaver specified in the 3GPP TS 25.212 for a WCDMA physical layer, a block interleaver, etc.

The second LDPC code decoder 410 performs LDPC code decoding on the codeword retransmitted at an even numbered request using the signal outputted from the interleaver 430. The second LDPC code decoder 410 can be the same as the first LDPC code decoder 440.

The deinterleaver 420 performs deinterleaving on the data outputted from the second LDPC code decoder 410, and it outputs the deinterleaved data to the first LDPC code decoder 440.

The deinterleaver 420 can be one corresponding to a well known random interleaver, a turbo code internal interleaver specified in the 3GPP TS 25.212 for a WCDMA physical layer, a block interleaver, etc.

The decoding apparatus 400 can further include a CRC check means for performing CRC checking on the data decoded by the first LDPC code decoder and determining whether or not the decoding is successful. The description of the CRC check means will be omitted since it is well known to those of ordinary skill in the art. The CRC check means determines whether or not the decoding is successful, and transmits the CRC check result to the encoding apparatus 300 using an ACK(CRC pass)/NACK(CRC failure) signal.

The encoding apparatus 300 can further include an encoding control means which, upon reception of the ACK/NACK from the decoding apparatus 400, determines whether or not to perform retransmission, and controls the first LDPC code encoder 310 and the second LDPC code encoder 330 so as to perform retransmission according to whether the retransmission is odd or even numbered.

Also, the decoding apparatus 400 can further include a decoding control means, which controls the decoding of the output signal of the first LDPC code decoder 440 and second LDPC code decoder 410 corresponding to the codeword newly transmitted or retransmitted from the encoding apparatus 300.

In the decoding apparatus 400 according to the second embodiment of the present invention, since the first LDPC code encoder 310 and the second LDPC code encoder 330 of the encoding apparatus 300 are connected in series, and the interleaver 320 is interposed between the first and second LDPC code encoders 310 and 330, the output of the first LDPC code decoder 440 becomes the final output signal. Accordingly, the CRC check means performs CRC checking only on the output of the first LDPC code decoder 440 in the second embodiment of the present invention for determining whether or not the decoding is successful, while the CRC check means performs a check on the respective outputs of the first LDPC code decoder 210 and the second LDPC code decoder 240 so as to determine whether or not the decoding is successful in the first embodiment of the present invention.

When the decoded data corresponding to the retransmitted codeword does not pass the CRC checking, the decoding apparatus 400 repeatedly performs decoding on the data by recursively passing the data through the interleaver 430, the second LDPC code decoder 410, the deinterleaver 420, and the first LDPC code decoder 440 rather than transmitting the checking result to the encoding apparatus 300.

The operation of the encoding and decoding apparatus using LDPC codes in the HARQ system according to the second embodiment of the present invention will be described hereinafter.

Firstly, the transmit side encoding apparatus 300 encodes the information signal to be transmitted with the first LDPC code encoder 310 and then transmits the encoded information signal to the receive side decoding apparatus 400.

If receiving an ACK from the decoding apparatus 400, which indicates that the transmitted signal is successfully decoded, the encoding apparatus 100 inputs a new information signal to the first LDPC code encoder 310 so as to repeatedly transmit in the above-explained manner.

On the other hand, if receiving a NACK from the decoding apparatus 400, which requests retransmission of the previously transmitted signal, the encoding apparatus 300 determines whether the retransmission request is odd or even numbered. If the retransmission request is the second or later and is even numbered, the encoding apparatus 300 controls in order for the interleaver 320 to interleave the codeword encoded by the first LDPC code encoder 310 and in order for the second LDPC code encoder 330 to encode the output of the interleaver 320, such that the code word generated by the second LDPC code encoder 330 is transmitted to the decoding apparatus 400. On the other hand, if the retransmission request is odd numbered, the encoding apparatus 300 controls such that the first LDPC code encoder 310 generates a codeword identical with the initially transmitted one and transmits the generated codeword to the decoding apparatus 400.

If receiving an initial transmission from the encoding apparatus 300, the decoding apparatus 400 controls such that the first LDPC code decoder 440 performs recursive decoding on the received signal and CRC checking on the output of the first LDPC code decoder 440, determines whether or not the decoding is successful, and then transmits ACK (successful decoding) or NACK (decoding failure) according to the determination result. If the decoding fails, the decoding result is stored in a storage means.

If receiving a secondly retransmitted codeword from the encoding apparatus 300 due to a decoding failure, the second LDPC code decoder 410 performs recursive decoding on the secondly received codeword together with data obtained by decoding the firstly received codeword with the first LDPC code decoder 440, after interleaving the output of the first LDPC code decoder 440 with the interleaver 430, and the deinterleaver 420 performs deinterleaving on the output of the second LDPC code decoder 410 and inputs the deinterleaved data to the first LDPC code decoder 440. The first LDPC code decoder 440 performs recursive decoding on the output of the deinterleaver 420 with the firstly received codeword, performs CRC checking, and determines whether or not the decoding is successful. If the decoding is successful, the decoding apparatus transmits ACK to the transmit side.

On the other hand, if the decoding fails, the decoding apparatus 400 performs interleaving on the output of the first LDPC code decoder 440 with the interleaver 430, and performs recursive decoding the output of the interleaver 430 with the second LDPC code decoder 410, performs deinterleaving on the output of the second LDPC code decoder 410 with the deinterleaver 420, and performs recursive decoding on the output of the deinterleaver 420 with the first LDPC code decoder 440. Then, the decoding apparatus performs a CRC check and determines whether or not the decoding is successful. If the decoding is successful, the ACK is transmitted to the encoding apparatus 300. Otherwise, decoding is repeatedly performed in the above manner. If it is determined that the decoding result is a failure after a predetermined number of decoding operations, the decoding apparatus 400 transmits the NACK to the encoding apparatus 300 for requesting retransmission.

In short, if receiving an odd numbered retransmission, the decoding apparatus 400 performs recursive decoding on the currently received codeword together with the output of the first LDPC code decoder corresponding to the previously received even numbered codeword. If the decoding fails, the second LDPC code decoder 410 and the first LDPC code decoder 440 perform recursive decoding in cooperation with the interleaver 430 and the deinterleaver 420 a predetermined number of times.

On the other hand, if receiving an even numbered retransmission, the second LDPC code encoder 410 performs decoding on the codeword currently received and the first LDPC code decoder 440 performs decoding on the output of the second LDPC code decoder 410 with the decoding result of the previously received odd numbered codeword. During the CRC checking, if it is determined that the decoding has failed, the second LDPC code decoder 410 and the first LDPC code decoder 440 perform recursive decoding in cooperation with the interleaver 430 and the deinterleaver 420 a predetermined number of times.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

In the present invention, LDPC codes are used so as to reduce the error flow effect and decoding time, resulting in improvement of the data transmission efficiency.

Also, since the interleaver is interposed between the LDPC code encoders and the two decoders perform decoding by referring to information on neighbor symbols, the error correction possibility increases, resulting in an increase of coding gain and packet data transmission efficiency.

What is claimed is:

1. An encoding apparatus for encoding input information data using LDPC (low density parity check) codes and transmitting encoded data to a decoding apparatus in a hybrid automatic repeat request system, the encoding apparatus comprising:
    a first LDPC code encoder for performing LDPC code encoding on the input information data and transmitting the encoded data to the decoding apparatus;
    an interleaver for interleaving the input information data; and
    a second LDPC code encoder arranged in parallel with the first LDPC code encoder, for performing LDPC code encoding on an output of the interleaver,
    wherein the first LDPC code encoder transmits an output signal to the decoding apparatus at odd numbered retransmissions in response to a retransmission request from the decoding apparatus, and
    the second LDPC code encoder transmits an output signal to the decoding apparatus at even numbered retransmissions in response to the retransmission request from the decoding apparatus.

2. The encoding apparatus of claim 1, further including an encoding controller for controlling the first LDPC code encoder for odd numbered retransmissions and controlling the second LDPC code encoder for even numbered retransmissions, when receiving a retransmission request from the decoding apparatus.

3. The encoding apparatus of claim 1, wherein the first LDPC code encoder and the second LDPC code encoder have the same generating matrix and parity check matrix.

4. The encoding apparatus of claim 3, wherein the first and second LDPC code encoders perform retransmission according to a Chase combining scheme in response to the retransmission request from the decoding apparatus.

5. A decoding apparatus for decoding LDPC code encoded codewords received from an encoding apparatus in a hybrid automatic repeat request system, the decoding apparatus comprising:
    a first LDPC code decoder and a second LDPC code decoder for performing LDPC code decoding on an LDPC code coded codeword transmitted from the encoding apparatus;
    an interleaver for interleaving an output of the first LDPC code decoder and outputting the interleaved data to the second LDPC code decoder; and
    a deinterleaver for deinterleaving an output of the second LDPC code decoder and outputting the deinterleaved data to the first LDPC code decoder,
    wherein the first LDPC code decoder performs decoding on the codeword newly received from the encoding apparatus and an odd numbered codeword retransmitted from the encoding apparatus due to a transmission error,
    the second LDPC code decoder performs decoding on an even numbered codeword retransmitted from the encoding apparatus due to a transmission error,
    the codeword newly transmitted from the encoding apparatus is processed and then finally outputted from the first LDPC code decoder, and
    the codeword retransmitted from the encoding apparatus is processed and then finally outputted from the deinterleaver.

6. The decoding apparatus of claim 5, further including:
    a CRC (cyclic redundancy code) check unit for performing CRC checking on the outputs of the first and the second LDPC code decoders; and
    a decoding controller for determining whether or not the decoding is successful according to a result of the CRC checking, feeding back a checking result to the encoding apparatus, and controlling the first and second LDPC code decoders to receive the newly transmitted codeword and retransmitted codeword and perform decoding on them.

7. The decoding apparatus of claim 5, wherein the first LDPC code decoder performs decoding on the odd numbered retransmitted codeword using the output of the deinterleaver.

8. The decoding apparatus of claim 5, wherein the second LDPC code decoder performs decoding on the even numbered retransmitted codeword using the output of the interleaver.

9. The decoding apparatus of claim 5, wherein when the retransmission is requested due to a CRC check failure on the output of the first LDPC code decoder, the second LDPC code decoder receives an even numbered retransmitted codeword from the encoding apparatus.

10. The decoding apparatus of claim 5, wherein when the retransmission is requested due to a CRC check failure on the output of the second LDPC code decoder, the first LDPC code decoder receives an odd numbered retransmitted codeword from the encoding apparatus.

11. An encoding apparatus for encoding input information data using LDPC (low density parity check) codes and transmitting encoded data to a decoding apparatus in a hybrid automatic repeat request system, the encoding apparatus comprising:
- a first LDPC code encoder for performing LDPC code encoding on the input information data and transmitting the encoded data to the decoding apparatus;
- an interleaver for interleaving the output of the first LDPC code encoder; and
- a second LDPC code encoder connected in series with the interleaver, for performing encoding on an output of the interleaver, and transmitting encoded data to the decoding apparatus;
- wherein the first LDPC code encoder performs an odd numbered retransmission on the input information data according to a retransmission request from the decoding apparatus;
- the second LDPC code encoder performs an even numbered retransmission on the input information data according to the retransmission request from the decoding apparatus; and
- the codeword transmitted by the encoding apparatus is finally output by the first LDPC code decoder.

12. The encoding apparatus of claim 11, further comprising an encoding controller for controlling the first LDPC code encoder for odd numbered transmission and controlling the second LDPC code encoder for even numbered transmission when the decoding apparatus requests a retransmission.

13. The encoding apparatus of claim 11, wherein the first and second LDPC code encoders perform retransmission according to a Chase combining scheme in response to the retransmission request from the decoding apparatus.

14. A decoding apparatus for decoding codewords, encoded with LDPC codes, received from an encoding apparatus in a hybrid automatic repeat request system, the decoding apparatus comprising:
- a first LDPC code decoder and a second LDPC code decoder for performing LDPC code decoding on the codeword transmitted from the encoding apparatus;
- an interleaver for interleaving an output of the first LDPC code decoder and outputting a result to the second LDPC code decoder; and
- a deinterleaver for deinterleaving the output of the second LDPC code decoder and outputting a result to the first LDPC code decoder,
- wherein the first LDPC code decoder performs decoding on a codeword newly received from the encoding apparatus and an odd numbered codeword retransmitted from the encoding apparatus due to a transmission error, and
- the second LDPC code decoder performs decoding on an even numbered codeword retransmitted from the encoding apparatus due to the transmission error.

15. The decoding apparatus of claim 14, further including:
- a CRC check unit for performing CRC checking on the output of the first LDPC code decoder; and
- a decoding controller for determining whether or not the decoding is successful according to a result of the CRC checking, feeding back a checking result to the encoding apparatus, and controlling the first and second LDPC code decoders to receive the newly transmitted codeword and retransmitted codeword and perform decoding on them.

16. The decoding apparatus of claim 14, wherein the first LDPC code decoder performs decoding on the odd numbered retransmitted codeword using the output of the deinterleaver.

17. The decoding apparatus of claim 14, wherein the second LDPC code decoder performs decoding on the even numbered retransmitted codeword using the output of the interleaver.

18. The decoding apparatus of claim 14, wherein the retransmission request is sent to the encoding apparatus when the output of the first LDPC code decoder fails to pass the CRC checking.

19. The decoding apparatus of claim 14, wherein when the output of the first LDPC code decoder corresponding to the odd numbered retransmitted codeword fails to pass the CRC checking, the output of the first LDPC code decoder is recursively decoded through the interleaver, the second LDPC code decoder, the deinterleaver, and the first LDPC code decoder.

20. The decoding apparatus of claim 14, wherein when the output of the first LDPC code decoder corresponding to the even numbered retransmitted codeword, which is processed by the second LDPC code decoder and deinterleaver, fails to pass the CRC checking, the output of the first LDPC code decoder is recursively processed by the interleaver, the second LDPC code decoder, the deinterleaver, and the first LDPC code decoder.

* * * * *